US007613070B2

(12) United States Patent
Ha

(10) Patent No.: US 7,613,070 B2
(45) Date of Patent: Nov. 3, 2009

(54) INTERLEAVED INPUT SIGNAL PATH FOR MULTIPLEXED INPUT

(75) Inventor: Chang Wan Ha, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/336,330

(22) Filed: Dec. 16, 2008

(65) Prior Publication Data

US 2009/0097331 A1    Apr. 16, 2009

Related U.S. Application Data

(63) Continuation of application No. 11/527,948, filed on Sep. 26, 2006, now Pat. No. 7,483,334.

(51) Int. Cl.
*G11C 8/00* (2006.01)
(52) U.S. Cl. ............... 365/233.1; 365/189.05; 365/230.08; 365/230.01
(58) Field of Classification Search ............ 365/189.05, 365/230.08, 230.01, 233.1
See application file for complete search history.

(56) References Cited

U.S. PATENT DOCUMENTS

| | | | |
|---|---|---|---|
| 4,695,952 A | 9/1987 | Howland | 364/200 |
| 5,261,068 A | 11/1993 | Gaskins et al. | 395/425 |
| 5,408,129 A | 4/1995 | Farmwald et al. | 257/692 |
| 5,410,680 A | 4/1995 | Challa et al. | 395/500 |
| 6,044,429 A | 3/2000 | Ryan et al. | 710/131 |
| 6,415,340 B1 | 7/2002 | Ryan et al. | 710/52 |
| 6,512,719 B2 | 1/2003 | Fujisawa et al. | 365/233 |
| 6,564,285 B1 | 5/2003 | Mills et al. | 711/103 |
| 6,571,307 B1 | 5/2003 | Kuo et al. | 710/305 |
| 6,614,691 B2 | 9/2003 | Roohparvar | 365/185.23 |
| 6,724,686 B2 | 4/2004 | Ooishi et al. | 365/233 |
| 6,807,598 B2 | 10/2004 | Farmwald et al. | 710/305 |
| 6,907,493 B2 | 6/2005 | Ryan | 710/315 |
| 6,928,024 B2 | 8/2005 | Pfeiffer et al. | 365/230.03 |
| 7,080,275 B2 | 7/2006 | Abedifard et al. | 713/401 |
| 2001/0024135 A1 | 9/2001 | Harrison | 327/276 |
| 2001/0033245 A1 | 10/2001 | Campanale et al. | 341/200 |
| 2002/0003747 A1 | 1/2002 | Yahata et al. | 365/233 |
| 2002/0016884 A1 | 2/2002 | Ryan et al. | 711/101 |
| 2002/0054516 A1* | 5/2002 | Taruishi et al. | 365/189.05 |
| 2002/0136063 A1 | 9/2002 | Keeth et al. | 365/189.05 |
| 2003/0196078 A1 | 10/2003 | Wise et al. | 712/300 |
| 2004/0052138 A1 | 3/2004 | Penney | 365/202 |
| 2006/0095808 A1 | 5/2006 | Abedifard et al. | 713/400 |
| 2006/0133126 A1 | 6/2006 | Fujisawa et al. | 365/63 |
| 2006/0253665 A1 | 11/2006 | Mailloux et al. | 711/154 |
| 2008/0080291 A1 | 4/2008 | Ha | 365/230.06 |

* cited by examiner

*Primary Examiner*—Thong Q Le
(74) *Attorney, Agent, or Firm*—Dorsey & Whitney LLP

(57) ABSTRACT

System and method for latching input signals from multiplexed signal lines. An input signal path includes a command path and an address path. In one embodiment, a command latch of the command path latches commands from the input signals and the address path includes a plurality of address latches that latch addresses from the input signals in an interleaved manner. In another embodiment, the command path includes a plurality of command latches that latch commands from the input signals in an interleaved manner and the address path includes a plurality of address latches that latch addresses from the input signals in an interleaved manner.

21 Claims, 6 Drawing Sheets

INTERLEAVED INPUT SIGNAL PATH FOR MULTIPLEXED INPUT

CROSS-REFERENCE TO RELATED APPLICATION

This application is a continuation of U.S. patent application Ser. No. 11/527,948, filed Sep. 26, 2006, and issued as U.S. Pat. No. 7,483,334 on Jan. 27, 2009 which application is incorporated by reference herein.

TECHNICAL FIELD

Embodiments of the invention relate generally to an input signal path for multiplexed signal lines, and more specifically, to an input signal path having separate command and address paths.

BACKGROUND OF THE INVENTION

As known, conventional NAND flash memory devices typically multiplex input/output (I/O) lines for receiving command, address, and data signals. Some commands, such as a program (i.e., write) command, require all three different types of information to be provided to the memory device. That is, in order to program memory cells with new data, a write command is issued, then the address of the memory cells that will be programmed is provided, and finally, data to be programmed is provided. A confirmation command is typically issued after the data is provided to the memory device indicating the end of the command. All of this information is provided to the memory device using the same I/O lines.

Control signals are used to differentiate the types of signals when latching the different information into the memory device. For example, typical control signals CLE and ALE are brought to a HIGH logic level to indicate to the memory device that the signals that will be latched in response to the next rising edge of a write enable signal (WE#) are either a command or an address, respectively. Thus, when the CLE signal is HIGH (and the ALE signal is LOW), the signals latched from the I/O lines in response to a rising edge of the WE# signal represent a command. In contrast, when the ALE signal is HIGH (and the CLE signal is LOW), the signals latched from the I/O lines in response to a rising edge of the WE# signal represent an address. When both the CLE and ALE signals are LOW, the signals latched from the I/O lines in response to a rising edge of the WE# signal represent data.

FIG. 1 illustrates a conventional input signal path 100 for receiving and internally routing commands and addresses that are latched by a data latch 108 from signals applied to a DQ pad and buffer 104. The DQ pad and buffer 104 represents the I/O signal lines to which external command, address, and data signals are applied to the memory. The signals are latched by the data latch 108 in response to the WE# signal, and commands and addresses are provided to a command decoder 112 and column address latches 122-127, respectively, which are all coupled to an output of the data latch 108. Conventional clock logic 118 generates various internal clock signals and pulses in response to the CLE, ALE and WE# signals to clock the address latches 122-127 and clock a command state machine 116 to generate internal control signals for executing the command in response to receiving the internal command signals from the command decoder 112. Gating logic 120, 130, 140, 150, 160 are used to couple Clk_add_1st-Clk_add_5th signals to respective address latches 122-127 when an active enable signal is output by the command state machine 116. The enable signal is active for commands that require latching of addresses, for example, read and program commands.

As will be explained in more detail below, the input signal path 100 is shown to receive an address having five parts over five WE# clock cycles, each part including up to 8 bits of the total address. As shown, the address latch 122 is clocked by the Clk_add_1st signal to latch bits 0-7 (eight bits) of a first part of the address, the address latch 123 is clocked by the Clk_add_2nd signal to latch bits 0-3 (four bits) of a second part of the address, the address latches 124, 125 are clocked by the Clk_add_3rd signal to latch bits 0-5 (six bits) and bits 6-7 (two bits), respectively, of the third part of the address, the address latch 126 is clocked by the Clk_add_4th signal to latch bits 0-7 (eight bits) of the fourth part of the address, and the address latch 127 is clocked by the Clk_add_5th signal to latch bits 0-1 (two bits) of the fifth part of the address.

FIG. 2 is a timing diagram of various signals of the input signal path 100 during a page read operation. At time T1 the CLE signal transitions HIGH to indicate to the memory that the signals provided to the DQ pad and buffer 104 (represented in FIG. 2 as Padq signals) at the next rising edge of the WE# signal represent a command. The command signals are provided to the DQ pad and buffer 104 shortly after the CLE signal goes HIGH and the WE# signal transitions HIGH at time T2 to clock the data latch 108 to latch the signals at the DQ pad and buffer 104. As shown in FIG. 2, the command provided to the memory is a page read command 00H. After a response and propagation delay of the data latch 108, the latched 00H command is output by the data latch 108 (represented in FIG. 2 as the Dqin signals) to the command decoder 112 at time TA. The command decoder 112 decodes the 00H command and generates internal command signals (not shown) to be provided to the command state machine 116. The command state machine 116 receives the internal command signals and begins generating internal control signals in response to a ltcmd pulse at times TB-TC. The ltcmd signal is generated in response to the previous clock cycle of the WE# signal and the HIGH CLE signal.

During the time the data latch 108 is latching the 00H command, the command decoder 112 is generating the internal command signals, and the command state machine 116 begins generating internal control signals at time TB, the CLE signal provided to the memory is transitioned LOW at time T3 and the ALE signal is transitioned HIGH at time T4 to indicate that the signals provided to the memory on DQ pad and buffer 104 at the next rising edge of the WE# signal represent addresses. As shown in FIG. 2, the address provided to the memory is the first address A1 of five parts of addresses (i.e., A1-A5). The rising edge of the WE# signal at time T5 clocks the data latch 108 and shortly thereafter at time TD the latched address is output at time TD. The Clk_add_1st pulse is HIGH at times TE-TF to clock the address latch 122 to latch bits 0-7 of the A1 address.

Before the next rising edge of the WE# signal at time T6 (ALE continues to be HIGH), the signals provided to the DQ pad and buffer 104 are changed to the second address A2 of the five part address. The A2 address is latched by the data latch 108 in response to the rising edge of the WE# signal at time T6. The signals provided to the DQ pad and buffer 104 are latched, and after a response and propagation delay, the A2 address is output by the data latch 108 at time TG. The Clk_add_2nd pulse at times TH-TI clocks the address latch 123 to latch bits 0-3 of the A2 address.

The third through fifth addresses A3-A5 are latched in a similar manner by the rising edges of the WE# signal at times T7-T9, with the rising edge of the WE# signal clocking the data latch 108 to latch the A3 address at time T7 (with the A3 address available at time TJ to be latched by address latches 124, 125 in response to the Clk_add_3rd pulse at times TK-TL), the rising edge of the WE# signal clocking the data latch 108 to latch the A4 address at time T8 (with the A4 address available at time TM to be latched by address latch 126 in response to the Clk_add_4th pulse at times TN-TO), and the rising edge of the WE# signal clocking the data latch 108 to latch the A5 address at time T9 (with the A5 address available at time TP to be latched by address latch 127 in response to the Clk_add_5th pulse at times TQ-TR). At time T10, the ALE signal is transitioned low indicating that no more addresses will be provided to the memory.

At time T11, the CLE signal is transitioned HIGH to indicate that another command will be provided to the memory over the DQ pad and buffer 104. A confirmation command (i.e., 30H) is issued to the memory to indicate the end of the current command. At the next rising edge of the WE# signal at time T12, the 30H command is latched by the data latch 108 and the CLE signal is transitioned LOW at time T13 to end provision of the current command. With the 30H command latched at T12, the output of the data latch 108 provides the 30H command at time TS to the command decoder 112. The command decoder 112 decodes the 30H command and generates internal command signals. In response to the ltcmd pulse at times TT-TU, the command state machine 116 inputs the internal command signals and generates corresponding internal control signals. A status command (70H) is also issued to the memory by transitioning the CLE signal HIGH at time T14 and providing a 70H command prior to the next rising edge of the WE# signal. The data latch 108 is clocked by the rising edge of the WE# signal at time T15 to latch the 70H command. Soon after latching, the output of the data latch 108 provides the 70H command to the command decoder 112 at time TV. Internal command signals are generated and are provided to the command state machine 116, which inputs the internal command signals in response to the ltcmd pulse at times TW-TX.

In programming data to the memory, the time for the program operation to complete can be divided into three different time ranges: (1) command and address writing time, (2) data loading time, and (3) programming time. Using an example of a write cycle time tWC of 35 ns (i.e., the period of the WE# signal), the three time ranges can typically be about 245 ns (i.e., 7×35 ns) for command and address writing time, 150 us for the programming time, and assuming that data for a full page is being loaded (further assuming a page is 2 kbytes and a byte-wide I/O lines), 71.7 us (i.e., 35 ns×2 kbytes) for the data loading time. As illustrated by the present example, the command and address writing time is nearly negligible, but the data loading time can be almost one-third of the total time for the program operation to complete.

In an effort to decrease the overall time for a program operation to complete, which is considered desirable, manufacturers are allows the use of shorter tWC to reduce the data loading time. A small decrease in tWC may have a relatively large impact where considerable data, such as data for an entire page, is being loaded. However, as the allowable tWC is decreased, internal timing margins of the memory may be decreased as well, raising potential issues with proper operation. This can be illustrated with reference to the timing diagram of FIG. 2. Although the timing diagram of FIG. 2 is directed to a page read command, decreasing tWC affects the internal timing margins of both read and program operations.

As previously discussed, the Dqin signal represents the output of the data latch 108, to which the command decoder 112/command state machine 116 and address latches 122-127 are coupled. As known, the command decoder 112/command state machine 116 and the address latches 122-127 need to receive and latch the respective data before the output of the data latch 108 changes in response to latching of signals at the next rising edge of the WE#. As shown in FIG. 2, the output of the data latch 108 generally transitions after a time of tWC. As previously described, pulses of the ltcmd signal are used to clock the command state machine 116 and pulses of the Clk_add_1st-Clk_add_5th signals are used to clock the address latches 122-127. The pulses of the ltcmd and Clk_add_1st-Clk_add_5th signals are generated in response to the previous rising edge of the WE# signal. For example, pulses 202, 214, and 216 of the ltcmd signal are generated in response to the rising edges of the WE# signal at time T2, T13, and T15, respectively, to latch the commands 00H, 30H, and 70H from Dqin. Pulses 204-212 of the Clk_add_1st-Clk_add_5th signals are generated in response to the rising edges of the WE# signal at times T5-T9, respectively, to latch addresses A1-A5 from Dqin.

For command and addresses to be accurately latched from Dqin, the pulses must occur at a time when the Dqin signals are stable. As known, the timing of pulses (i.e., when the pulses occur) and pulse width can vary slightly due to changes in temperature and supply voltage. To accommodate variations in timing and pulse width, the pulses occur after a minimum internal set-up time after a transition of the Dqin signals. The pulse width should be sufficient to clock a latch circuit to latch the signals, but leave a minimum internal hold time before a next transition of the Dqin signals. With reference to FIG. 2, and for the pulse 202 clocking the command state machine 116, the set-up time is between TA-TB, the pulse width between TB-TC, and the hold time between TC-TD. As for the pulse 204 clocking the address latch 122, the set-up time is between TD-TE, the pulse width between TE-TF, and the hold time between TF-TG. The set-up, pulse width, and hold times for the pulses 204-216 are generally the same as for the pulses 202 and 204.

As a shorter tWC is used (resulting in a shorter period of WE#) to reduce data load time, as previously discussed, the set-up time, hold time, pulse width or all three will also be reduced, thus, reducing the timing margin for accurately latching the command, address, and data signals. As a result, a lower limit to tWC exists due to the variations in the timing and pulse width of the latch pulses. In order for tWC to be further reduced, there is a need for a input signal path that provides timing margin for latching input signals provided to a memory while allowing the use of a shorter tWC.

DETAILED DESCRIPTION OF PREFERRED EMBODIMENTS

Certain details are set forth below to provide a sufficient understanding of the invention. However, it will be clear to one skilled in the art that the invention may be practiced without these particular details. Moreover, the particular embodiments of the present invention described herein are provided by way of example and should not be used to limit the scope of the invention to these particular embodiments. In other instances, well-known circuits, control signals, and timing protocols have not been shown in detail in order to avoid unnecessarily obscuring the invention.

Figure 1:
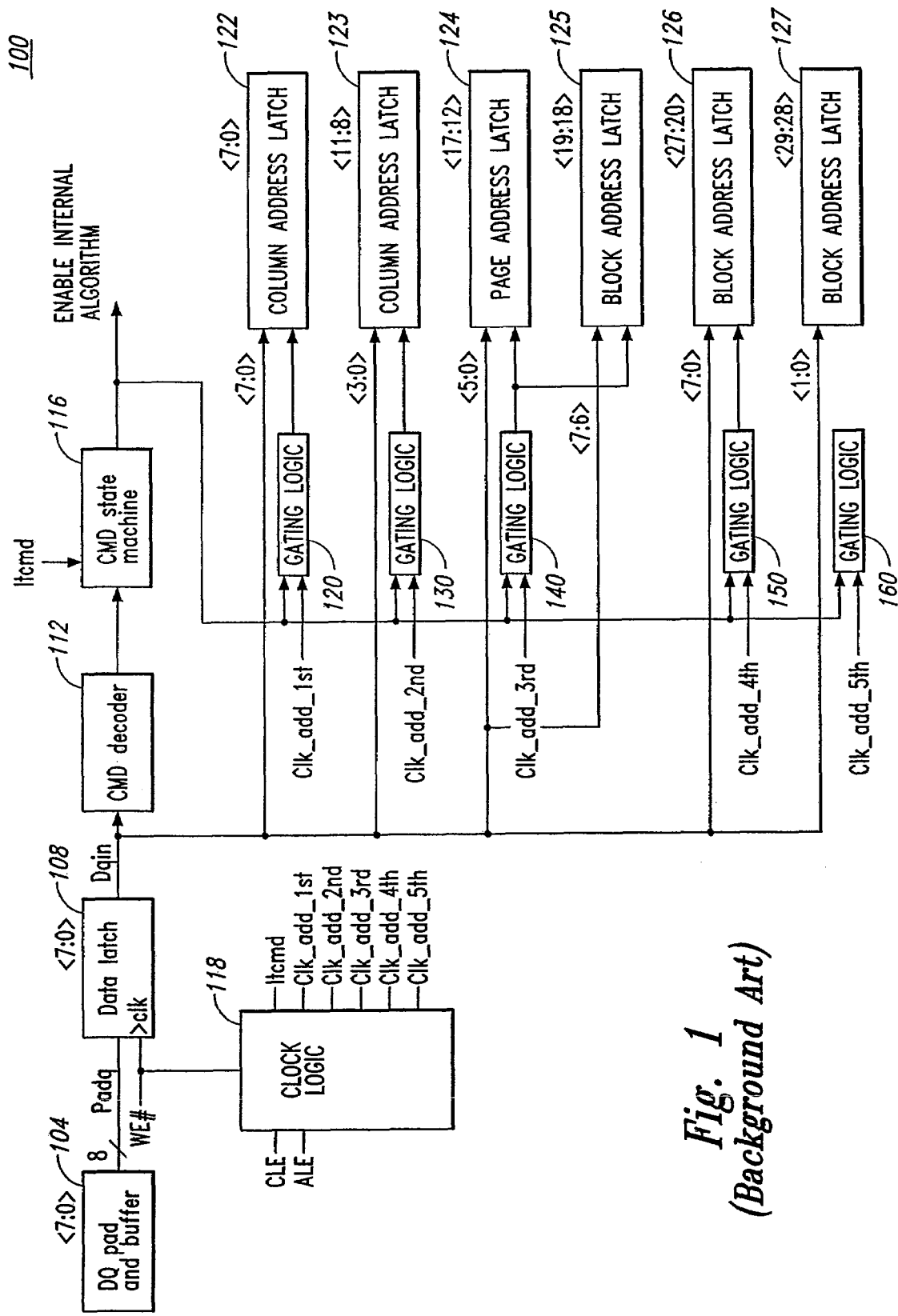
FIG. 1 is a block diagram of a conventional input signal path.
Figure 3:
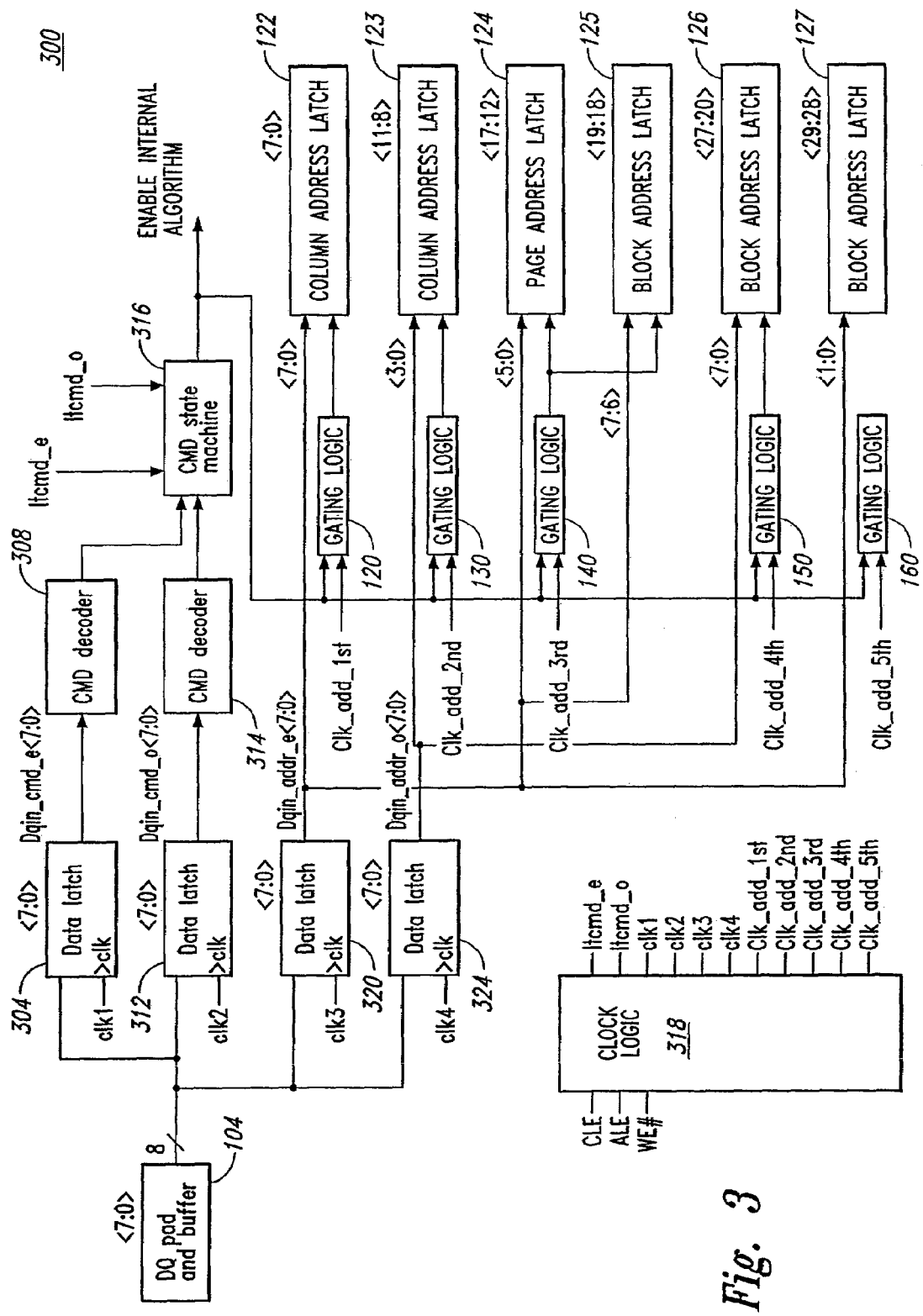
FIG. 3 is a block diagram of an input signal path according to an embodiment of the invention.

FIG. 3 illustrates an input signal path 300 according to an embodiment of the present invention. The input signal path 300 includes components that were previously described with reference to the input signal path 100 of FIG. 1. In contrast to the input signal path 100, however, the input signal path 300 includes separate signal paths for latching commands and addresses. Each signal path includes a plurality of data latches that are operated in an interleaved fashion to provide greater internal timing margin, as will be explained in more detail below. The signal path for commands includes an even command signal path, represented by a data latch 304 and command decoder 308, and further includes an odd command signal path, which is represented by a data latch 312 and command decoder 314. The data latches 304 and 312 are clocked by clock signals clk1 and clk2, that are generated by a clock logic 318 in response to the WE# signal and a HIGH CLE signal. Internal command signals generated by the command decoders 308, 314 are provided to a command state machine 316 that is clocked by command latch signals ltcmd_e and ltcmd_o, which are used to clock-in the internal signals from the even command signal path and the odd command signal path, respectively.

The signal path for addresses includes even and odd data latches 320 and 324 that are clocked by clock signals clk3 and clk4. The clk3 and clk4 signals are generated by the clock logic 318 in response to the WE# signal and a HIGH ALE signal. The data latches 320, 324 output the latched address signals to an appropriate address latch 122-127. As with the input signal path 100 (FIG. 1), each of the address latches 122-127 is coupled to receive particular bits of the address signals and are clocked by a respective clock signal to latch the correct address information provided to the memory over five WE# clock cycles. Namely, the address latch 122 latches bits 0-7 from the A1 signals in response to the Clk_add_1st signal, the address latch 123 latches bits 0-3 from the A2 signals in response to the Clk_add_2nd signal, the address latch 124 latches bits 0-5 and the address latch 125 latches bits 6 and 7 from the A3 signals in response to the Clk_add_3rd signal, the address latch 126 latches bits 0-7 from the A4 signals in response to the Clk_add_4th signal, and the address latch 127 latches bits 0 and 1 from the A5 signals in response to the Clk_add_5th signal. In contrast to the input signal path 100, the address latches 122-127 of the input signal path 300 are coupled to receive the address bits from one of the two data latches 320, 324, instead of having all the address latches 122-127 coupled to the single data latch 108.

Figure 2:
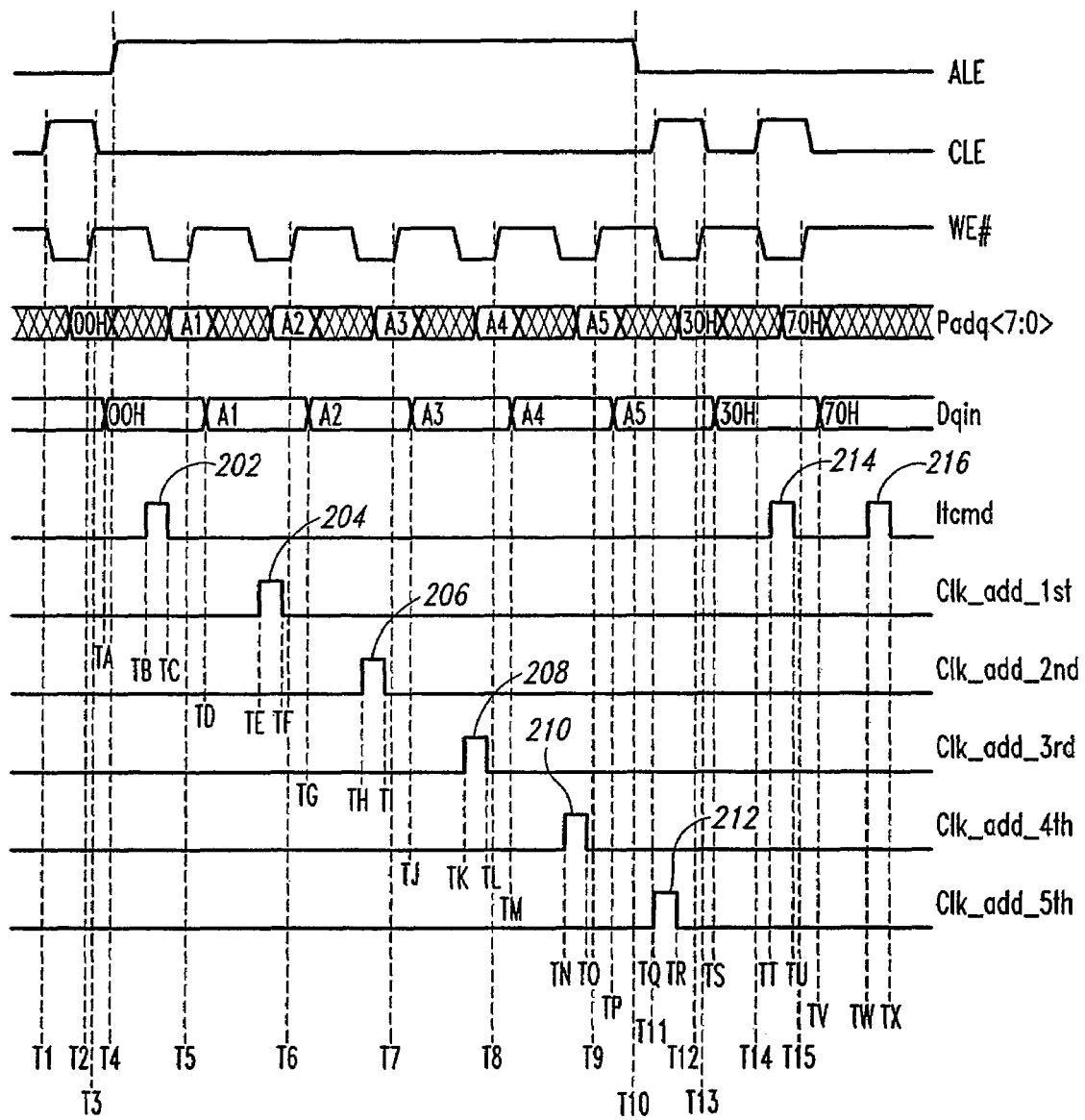
FIG. 2 is a timing diagram of various signals during operation of the conventional input signal path of FIG. 1.
Figure 4:
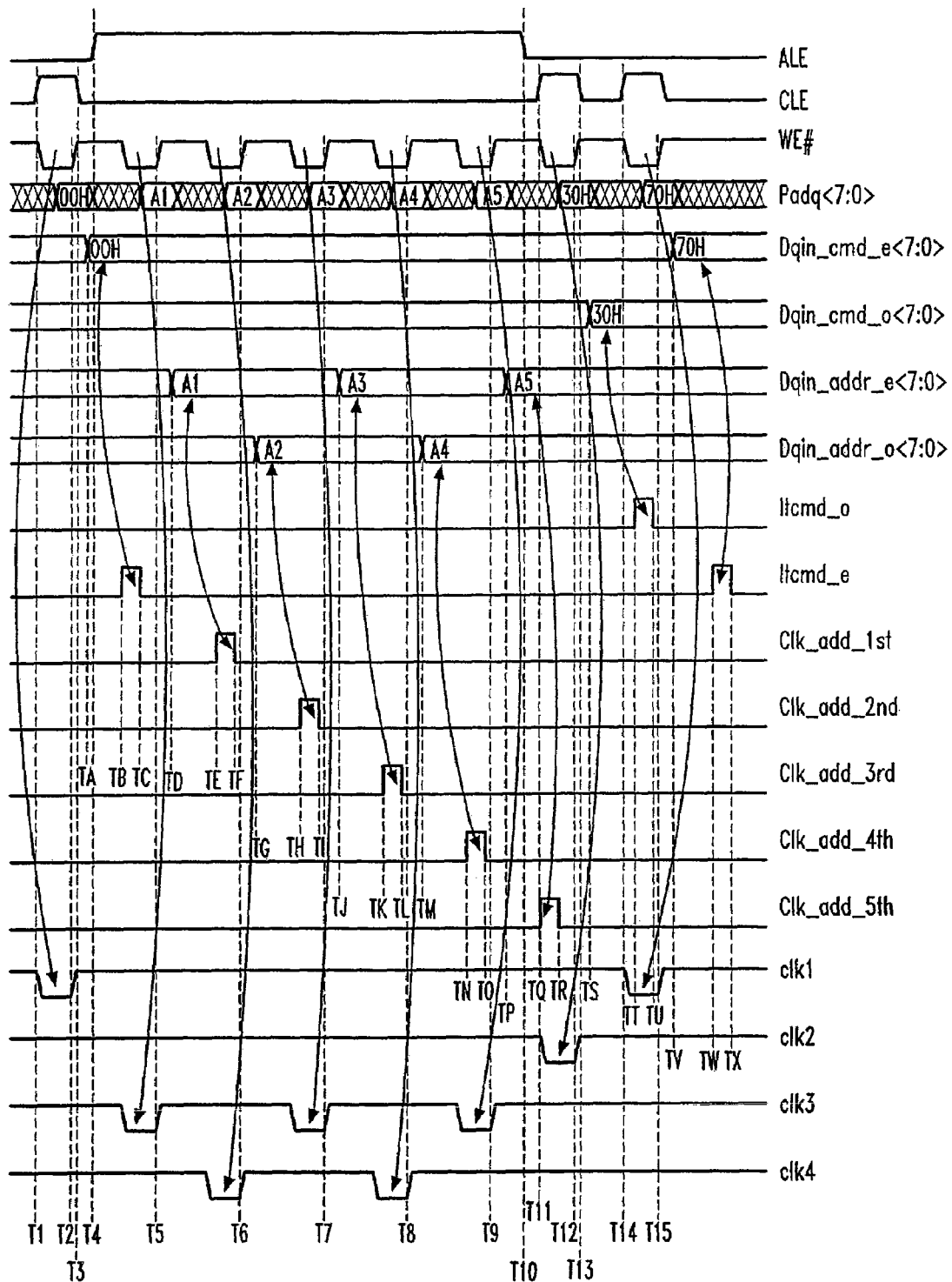
FIG. 4 is a timing diagram of various signals during operation of the input signal path of FIG. 3.

Operation of the input signal path 300 will be described with reference to the timing diagram of FIG. 4. The timing diagram of FIG. 4 illustrates similar signals to the timing diagram of FIG. 2, but further includes alternative and additional signals during operation of the input signal path 300. For example, the output for the four data latches 304, 312, 320, 324 (corresponding to Dqin_cmd_e, Dqin_cmd_o, Dqin_addr_e. and Dqin_addr_o) are illustrated in FIG. 4, whereas only Dqin is shown in FIG. 2. FIG. 4 also illustrates clk1-clk4 signals used to clock the data latches 304, 312, 320, 324, and instead of one command latch signal ltcmd, two command latch signals ltcmd_e and ltcmd_o are used to clock the command state machine 316. The clock and latch signals are generated by the clock logic 318 which is conventional in design and operation. It will be appreciated that such clock logic can be designed by those ordinarily skilled in the art based on an understanding obtained by the description provided herein.

Turning to FIG. 4, at time T1 the CLE is transitioned HIGH to indicate to the memory that the signals provided to the Dq pad and buffer 104 (represented in FIG. 4 as signals Padq) at the next rising edge of the WE# signal represent a command. The signals are provided to the DQ pad and buffer 104 shortly after the CLE signal goes HIGH and the WE# signal transitions HIGH at time T2 to receive the signals at the DQ pad and buffer 104. As shown in FIG. 4, the command provided to the memory is a page read command 00H. As previously discussed, the clock logic 318 generates clk1-clk4 signals to clock the data latches 304, 312, 320, and 324. As shown in FIG. 4, the clk1 and clk2 signals alternate in response to the WE# signal and a HIGH CLE signal to alternately clock the data latch 304 of the even command signal path and the data latch 312 of the odd command signal path. Assuming that the even command signal path is the next one to latch the input signals, the clk1 signal transitions HIGH at time T2 in response to the HIGH CLE signal and the WE# signal to clock the data latch 304 and latch the 00H command applied to the DQ pad and buffer 104. After a response and propagation delay of the data latch 304, the latched 00H command is output by the data latch 304 (represented in FIG. 4 as the Dqin_cmd_e signals) to the command decoder 308 at time TA. The command decoder 308 decodes the 00H command and generates internal command signals (not shown) to be provided to the command state machine 316. The command state machine receives the internal command signals and begins generating internal control signals in response to a ltcmd_e pulse at times TB-TC . The ltcmd_e signal is generated in response to the previous clock cycle of the WE# signal and the HIGH CLE signal.

During the time the data latch 304 is latching the 00H command, the command decoder 308 is generating the internal command signals, and the command state machine 316 begins generating internal control signals at time TB, the CLE signal provided to the memory is transitioned LOW at time T3 and the ALE signal is transitioned HIGH at time T4 to indicate that the signals provided to the memory on DQ pad and buffer 104 at the next rising edge of the WE# signal represent addresses. As shown in FIG. 4, the address provided to the memory is the first address AI of five parts of addresses (i.e., A1-A5). The clk3 and clk4 signals clock the data latches 320, 324, respectively, to alternately latch signals at the DQ pad and buffer 104. Assuming that data latch 320 is the next latch to be clocked, the clk3 signal has a rising edge at time T5 that corresponds to the rising edge of the WE# signal. The clk3 signal clocks the data latch 320 and shortly thereafter at time TD the latched address is output (represented in FIG. 4 as Dqin_addr_e signals). The Clk_add_1st pulse is HIGH at times TE-TF to clock the address latch 122 to latch bits 0-7 of the A1 address. The timing of the Clk_add_1st pulse-Clk_add_4th pulse and the operation of the address latches 122-127 are as previously described with respect to the input signal path 100 of FIG. 1.

Before the next rising edge of the WE# signal at time T6 (ALE continues to be HIGH), the signals provided to the DQ pad and buffer 104 are changed to the second address A2 of the five parts of addresses. As previously discussed, generation of the clk3 and clk4 signals in response to the WE# signal is alternated to interleave latching of signals by the data latches 320, 324. The A1 address was latched in response to the clk3 signal. As a result, the A2 address is latched by the data latch 324 in response to the clk4 signal, which has a rising edge at time T6 corresponding to the rising edge of the WE# signal. After a response and propagation delay, the A2 address is output by the data latch 324 (represented in FIG. 4 by Dqin_addr_o). The Clk_add_2nd pulse at times TH-TI clocks the address latch 123 to latch bits 0-3 of the A2 address.

The third through fifth addresses A3-A5 are latched in a similar manner by the rising edges of the WE# signal at times T7-T9, with the clk3 signal clocking the data latch 320 to latch the A3 address at time T7 (with the A3 address available at time TJ to be latched by address latches 124, 125 in response to the Clk_add_3rd pulse at times TK-TL), the clk4 signal clocking the data latch 324 to latch the A4 address at time T8 (with the A4 address available at time TM to be latched by address latch 126 in response to the Clk_add_4th pulse at times TN-TO), and the clk3 signal clocking the data latch 320 to latch the A5 address at time T9 (with the A5 address available at time TP to be latched by address latch 127 in response to the Clk_add_5th pulse at times TQ-TR). As illustrated by the present example, the A1-A5 addresses are latched by interleaving operation of the data latches 320 and 324 through alternating clk3 and clk4 signals in response to the WE# signal. At time T10, the ALE signal is transitioned LOW indicating that no more addresses will be provided to the memory.

At time T11, the CLE signal is transitioned HIGH to indicate that another command will be provided to the memory over the DQ pad and buffer 104. As previously described, a confirmation command (i.e., 30H) is issued to the memory. At the next rising edge of the WE# signal at time T12, the 30H command is latched by the data latch 312 in response to the clk2 signal. As previously described, the previous command (00H) is latched by the data latch 304 in response to the clk1 signal. Generation of the clk1 and clk2 signals in response to the WE# signal is alternated to interleave latching of commands. The CLE signal is transitioned low at time T13 to end provision of the current command. With the 30H command latched at T12, the output of the data latch 312 (represented in FIG. 4 as signals Dqin_cmd_o) provides the 30H command at TS to the command decoder 314. The command decoder 314 decodes the 30H command and generates internal command signals. In response to the ltcmd_o pulse at times TT-TU, the command state machine 316 inputs the internal command signals and generates internal control signals in response.

A status command is also issued to the memory by transitioning the CLE signal HIGH at time T14 and providing a 70H command prior to the next rising edge of the WE# signal. Since the data latch 312 of the odd command signal path latched the previously issued 30H confirmation command, the data latch 304 of the even command signal path is clocked by the clk1 signal at time T15 to latch the 70H command. Soon after latching, the output of the data latch 304 provides the 70H command to the command decoder 308. Internal command signals are generated at time TV and are provided to the command state machine 316, which inputs the internal command signals in response to the ltcmd e pulse at times TW-TX.

Separating the input signal path into separate command and address signal paths and having even and odd signal paths that are operated in an interleaved manner, increase internal timing margin for latching commands and addresses. For example, with respect to the A1 and A2 addresses that are latched by the data latches 320 and 324, respectively, the time over which the A1 address can be latched is between times TD-TJ and the time over which the A2 address can be latched is between times TG-TM. The internal set-up time (between TD-TE) and internal hold time (between TF-TJ) for the Clk_add_1st pulse at times TE-TF can be much longer since the A1 address is available for a longer time compared to the conventional input signal path 100. In the conventional input signal path 100, the internal set-up time, internal hold time, and the Clk_add_1st pulse was limited to approximately one clock cycle of the WE# signal. In contrast, in the input signal path 300 the internal set-up time, internal hold-time, and the Clk_add_1st pulse is spread over approximately two clock cycles of the WE# signal because the latching of addresses is interleaved between the two data latches 320, 324. As a result, the next address either of the data latches 320, 324 latches is occurs at every other rising edge of the WE# signal (due to alternating clk3 and clk4 signals, respectively) and not every rising edge of the WE# signal.

The same benefit previously described for the address input path is provided for commands latched by the data latches 304 and 312. For example, the 30H command and the 70H command latched by the data latches 312 and 304 and decoded by the command decoders 314, and 308, all respectively, allow for an internal set-up time, internal hold time, and a pulse width to be spread over approximately two clock cycles of the WE# signal rather than being limited to one WE# clock cycle, as in the case of the input signal path 100 of FIG. 1. As with the address input path of the input signal path 300, each data latch 304, 312 of the even and odd command signal paths can maintain the command at its output for a longer time since the soonest a subsequent command is latched by either data latch 304, 312 occurs two WE# clock cycles later in response to the clk1, clk2 signals, respectively.

The previous embodiment of the input signal path 300 has been described as including a command signal path having dual-interleaved signal paths and an address signal path having dual-interleaved signal paths. However, in alternative embodiments, the command signal path can have greater or fewer signal paths and the address signal path can have greater or fewer signal paths. For example, an alternative embodiment of the invention includes an address signal path having three-interleaved signal paths, each having a data latch for latching addresses provided to the memory, and further includes a separate data signal path having only one signal path with one data latch for latching commands. The present invention includes various embodiments having separate command and address signal paths, each of which can have different numbers of interleaved signal paths. Consequently, the previously discussed input signal path 300 of FIG. 3 is provided by way of example, and not intended to limit the present invention to the particular embodiment.

Figure 5:
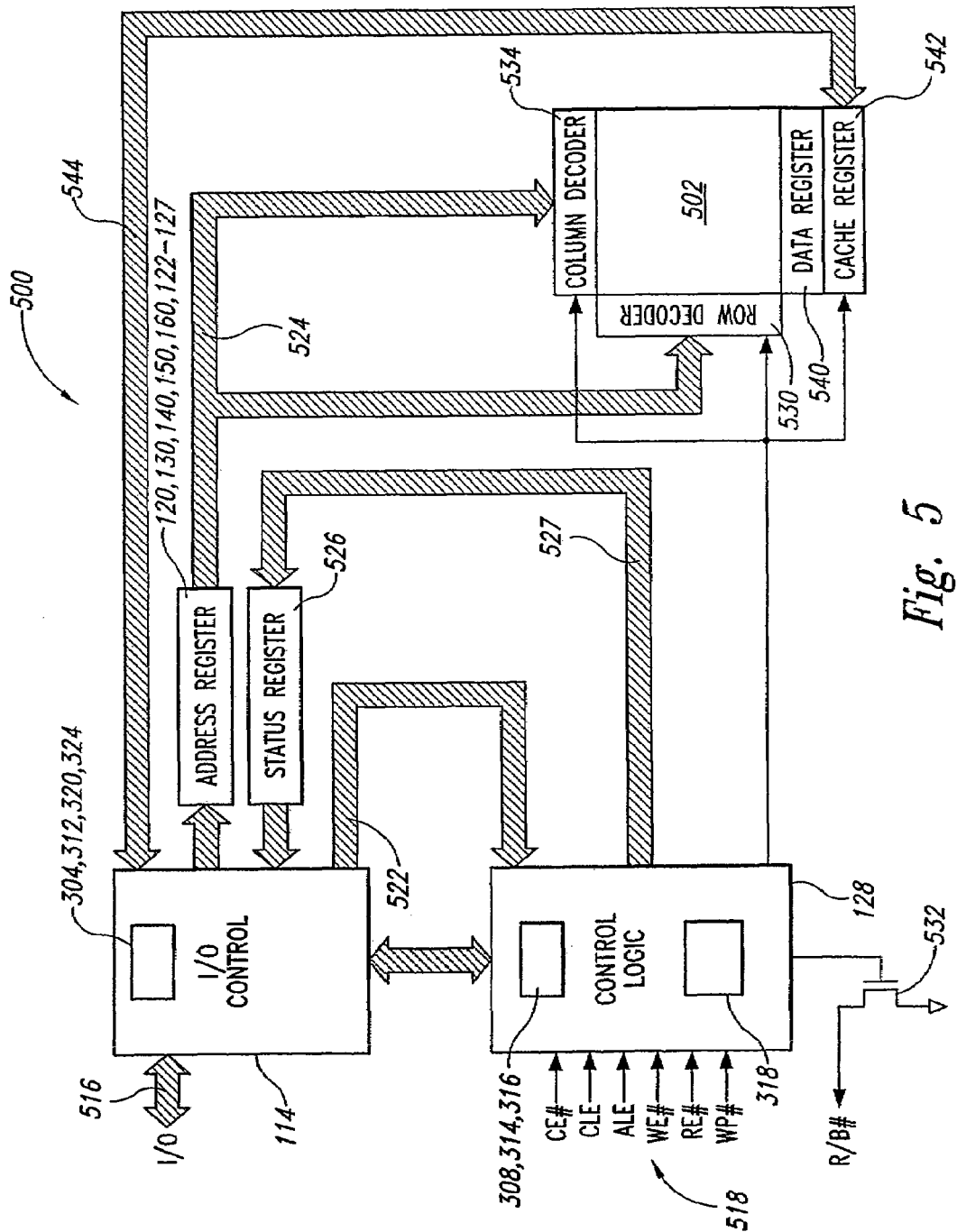
FIG. 5 is a block diagram of a flash memory having an input signal path according to an embodiment of the invention.

FIG. 5 is a simplified block diagram of a portion of a flash memory 500 that includes an input signal path according to an embodiment of the present invention. As shown in FIG. 5, the memory 500 has been simplified to focus on features of the memory that are helpful in understanding the present invention. A more detailed understanding of internal circuitry and functions of flash memories are known to those skilled in the art. The memory 500 includes a memory array 502 having a plurality of memory cells arranged in row and column fashion. Each of the memory cells includes a floating-gate field-effect transistor capable of holding a charge for the non-volatile storage of data. Each of the cells can be electrically programmed on an individual basis by charging the floating gate. The rows of memory array 502 are arranged in blocks, where a memory block is some discrete portion of the memory array 502. The memory cells generally can be erased in blocks. Data, however, may be stored in the memory array 502 in finer increments than a memory block. Row decoder and column decoder circuits 530, 534 decode memory addresses to access the corresponding memory locations in the memory array 502. Data register 540 and optional cache register 542 temporarily store data read from, or to be written to the memory array 502.

Command, address and data signals are provided to an I/O control 514 on device bus 516, which is multiplexed for receiving the various signals. The I/O control 514 includes data latches 304, 312, 320, and 324 (FIG. 3). Which of the various signals are being received is determined by control signals 518 provided to a control logic 528. In response to control signals 518 indicating that command signals are being provided on the device bus 516 to the I/O control 514, the command signals are received by the I/O control 514 and provided to the control logic 528 via internal command bus 522. The control logic 528 includes the command decoders 308, 314 and the command state machine 316. As previously discussed, commands are decoded and corresponding internal control signals are generated by the control logic 528 to perform the requested commands. In response to the control signals 518 indicating that address signals are being provided on the device bus 516 to the I/O control 514, the address signals are received and the corresponding addresses are latched in an address register, which includes gating logic 120, 130, 140, 150, 160 and address latches 122-127. A status register 526 is used to latch status information provided to it over an internal status bus 527 from the control logic 528. The status information is generated by the control logic 528 in response to receiving a command requesting the status of an operation. Clock logic 318 is included in the control logic 528, and as previously described, generates the appropriate clock signals to clock the data latches 304, 312, 320, 324, the command state machine 316, and the address latches 122-127.

The control logic 528 is coupled to a transistor 532 to provide a ready/busy signal R/B# that can be used for indicating the completion of various memory operations. The signal is typically HIGH, and transitions to LOW after a command is written to the device. When the current memory operation is completed, the RIB# signal transitions back to HIGH.

In operation, the memory array 502 can be accessed by providing a combination of control, command, and address signals. For example, to perform a read operation, a first combination of control signals 518 is provided to the control logic 528 to indicate that command signals are applied to the device bus 516. The control logic 528 generates internal control signals for the I/O control 514 to receive the command signals and for the corresponding command to be latched in the command register 528. The control logic 528 decodes the read command and begins to generate internal control signals for accessing the memory array 502.

A second combination of control signals 518 is provided to the control logic 528 to indicate that address signals are applied to the device bus 516. The control logic generates internal control signals for the I/O control 514 to receive the address signals and for the corresponding addresses to be latched in the address register 512. The addresses are provided to a row decoder circuit 530 and a column decoder circuit 534 via an internal address bus 524 for decoding the addresses and accessing the memory locations corresponding to the latched addresses.

A page of memory cells having the memory locations to be accessed is read from the memory array 502 and stored in a data register 540. The data from the page of memory is transferred to a secondary (and optional) cache register 542 before being provided to the I/O control 514 on an internal data bus 544. The cache register can be used to temporarily store the page of data in order to free the data register 540 to store another page of data for a subsequent access operation of the memory array 502. The page of data is transferred to the I/O control 514 from the cache register 542. Based on the addresses, the appropriate data from the page of data is output on the device bus 516.

A write operation occurs in a similar manner except that following the second combination of control signals a third combination of control signals are provided to the control logic 528 indicating that data to be written to the memory locations corresponding to the addresses is being provided on the device bus 516. The data received by the I/O control 514 is provided on the internal data bus 544 to the cache register 542 for writing to the memory array 502.

Figure 6:
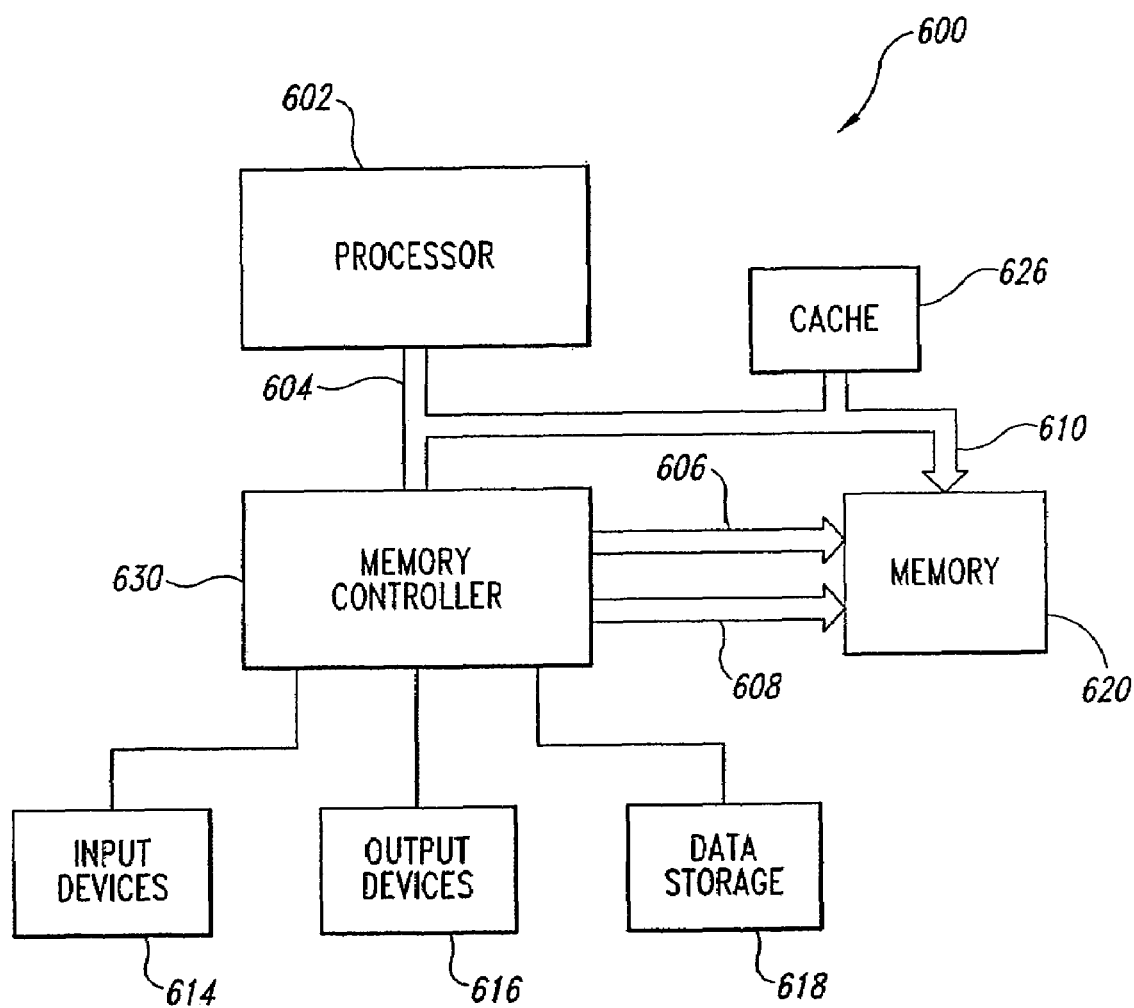
FIG. 6 is a processor-based system according to another embodiment of the invention.

The flash memory 500 can be used in various electronic systems. For example, it may be used in a processor-based system, such as a processor-based system 600 shown in FIG. 6. In one embodiment, the processor-based system is an embedded system having an embedded memory such as the flash memory 500. In another embodiment, the processor-based system 600 is a computer system including flash memory devices that include flash memory 500.

The processor-based system 600 includes a processor 602 for performing various computing functions, such as executing specific software to perform specific calculations or tasks. The processor 602 includes a processor bus 604 that normally includes an address bus, a control bus, and a data bus. The processor 602 is also typically coupled to cache memory 626, for temporarily storing data, and further coupled to a memory 620 through a memory controller 630. The memory 620 includes flash memory such as memory 500. The memory controller 630 normally includes a control bus 636 and an address bus 638 that are coupled to the memory 620. A data bus 640 is coupled from the memory 620 to the processor bus 604 either directly (as shown), through the memory controller 630, or by some other means.

In embodiments where the processor-based system 600 represents a computer system, the system 600 further includes input devices 614, such as a keyboard or a mouse, that are coupled to the processor 602 to allow a user to interface with the processor-based system 600. Typically, the processor-based system 600 also includes one or more output devices 616 coupled to the processor 602, such output devices typically being a printer or a video terminal. One or more data storage devices 618 are also typically coupled to the processor 602 to allow the processor 602 to store data in or retrieve data from internal or external storage media (not shown). Examples of typical storage devices 618 include hard disks, flash drives, compact and digital video disk read-only memories (CD- and DVD-ROMs).

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory device comprising:
   an input node configured to receive command and address signals;
   a first latch coupled to the input node, the first latch configured to latch command signals responsive to a command latch signal;
   a second latch coupled to the input node, the second latch configured to latch address signals responsive to a first address latch signal;

a third latch coupled to the input node, the third latch configured to latch address signals responsive to a second address latch signal; and clock logic coupled to the first, second, and third latches, the clock logic configured to receive a write enable signal and generate the command latch signal responsive to a first rising edge of the write enable signal, generate the first address latch signal responsive to a second rising edge of the write enable signal and the second address latch signal responsive to a third rising edge of the write enable signal.

2. The memory device according to claim 1 wherein the clock logic is configured to couple the first address latch signal to the second latch a plurality of times, a delay between two of the plurality of times greater than a period of the write enable signal.

3. The memory device according to claim 1 wherein the first, second, and third rising edges of the write enable signal are consecutive rising edges of the write enable signal.

4. The memory device according to claim 1 wherein the address signals latched by the second and third latches remain valid for a time longer than a period of the write enable signal.

5. The memory device according to claim 1 wherein the command latch signal is a first command latch signal, the memory device further comprising a fourth latch coupled to the input node, the fourth latch configured to latch command signals responsive to a second command latch signal, the clock logic further operable to generate the second command latch signal responsive to a fourth rising edge of the write enable signal.

6. The memory device according to claim 5 wherein the first and fourth rising edges of the write enable signal are consecutive rising edges of the write enable signal.

7. The memory device according to claim 1 wherein the clock logic is further configured to receive a command indication signal, the clock logic configured to generate the command latch signal responsive to receipt of the command indication signal and the first rising edge of the write enable signal.

8. The memory device according to claim 1 wherein the clock logic is further configured to receive an address indication signal, the clock logic configured to generate the first and second address latch signals responsive to receipt of the address indication signal and the second and third rising edges of the write enable signal, respectively.

9. A method for latching signals in a memory device, the method comprising:
   latching data from an input node to a first latch responsive to a command indication signal and a first rising edge of a write enable signal;
   latching data from the input node to a second latch responsive to an address indication signal and a second rising edge of the write enable signal; and
   latching data from the input node to a third latch responsive to the address indication signal and a third rising edge of the write enable signal.

10. The method according to claim 9 further comprising:
   receiving the command indication signal, address indication signal, and write enable signal.

11. The method according to claim 9 wherein the second and third rising edges of the write enable signal are consecutive rising edges.

12. The method according to claim 9 further comprising latching data from the input node to the second latch a plurality of times, a delay between two of the plurality of times greater than a period of the write enable signal.

13. The method according to claim 9 wherein the address signals latched by the second and third latches remain valid for a time longer than a period of the write enable signal.

14. The method according to claim 9, the method further comprising latching command signals from the input node to a fourth latch responsive to a fourth rising edge of the write enable signal.

15. The method according to claim 5 wherein the first and fourth rising edges of the write enable signal are consecutive rising edges of the write enable signal.

16. A method for controlling a memory device having an internal time for processing a latched signal, the method comprising:
   coupling a command indication signal to the memory device;
   coupling a write enable signal to the memory device, the write enable signal having a plurality of rising edges;
   coupling a command signal to an input node of the memory device, the memory device configured to latch the command signal responsive to the command indication signal and a first rising edge of the write enable signal;
   coupling an address indication signal to the memory device;
   coupling a first address signal to the input node of the memory device, the memory device configured to latch the first address signal responsive to the address indication signal and a second rising edge of the write enable signal; and
   coupling a second address signal to the input node of the memory device, the memory device configured to latch the second address signal responsive to the address indication signal and a third rising edge of the write enable signal, a time between the second and third rising edges being less than the internal time for processing a latched signal of the memory device.

17. The method according to claim 16 further comprising: generating the command indication signal, address indication signal, and write enable signal.

18. The method according to claim 16 wherein the second and third rising edges of the write enable signal are consecutive rising edges.

19. The method according to claim 16, wherein the command signal is a first command signal, the method further comprising coupling a second command signal to the input node, the memory device configured to latch the second command signal responsive to the command indication signal and a fourth rising edge of the write enable signal, a time between the first and fourth rising edges of the write enable signal being less than the internal time for processing a latched signal.

20. The method according to claim 19 wherein the first and fourth rising edges of the write enable signal are consecutive rising edges of the write enable signal.

21. The method according to claim 16 wherein the act of coupling the command indication signal, address indication signal, and write enable signal to the memory device comprises coupling the command indication signal, address indication signal, and write enable signal to clock logic of the memory device.

* * * * *